United States Patent

Ishida et al.

[11] Patent Number: 5,874,378
[45] Date of Patent: Feb. 23, 1999

[54] SINTERED ALUMINUM NITRIDE

[75] Inventors: Masanobu Ishida; Toshihiro Iwaida; Hiroshi Okayama, all of Kokubu, Japan

[73] Assignee: Kyocera Corporation, Kyoto, Japan

[21] Appl. No.: 881,110

[22] Filed: Jun. 23, 1997

[30] Foreign Application Priority Data

Jun. 28, 1996 [JP] Japan ..................................... 8-169535

[51] Int. Cl.$^6$ ................................................. C04B 35/581
[52] U.S. Cl. ........................ 501/98.4; 501/98.5; 501/152; 501/153; 501/154
[58] Field of Search ................................. 501/98.4, 98.5, 501/98.6, 152, 153, 154

[56] References Cited

U.S. PATENT DOCUMENTS

| | | | |
|---|---|---|---|
| 3,108,887 | 10/1963 | Lenie et al. | 501/98.4 |
| 4,591,537 | 5/1986 | Aldinger et al. | 501/98.5 |
| 4,833,108 | 5/1989 | Mizuno et al. | 501/98.5 |
| 5,001,089 | 3/1991 | Kasori et al. | 501/98.4 |
| 5,077,245 | 12/1991 | Miyahara | 501/98.5 |
| 5,314,850 | 5/1994 | Miyahara | 501/153 |
| 5,508,240 | 4/1996 | Komatsu et al. | 501/98.5 |
| 5,641,718 | 6/1997 | Horiguchi et al. | 501/152 |

*Primary Examiner*—Michael Marcheschi
*Attorney, Agent, or Firm*—Loeb & Loeb LLP

[57] ABSTRACT

A sintered aluminum nitride contains rare earth elements (RE) in amounts of from 3 to 10% by weight in terms of $RE_2O_3$, alkaline earth elements (R) in amounts of from 0.3 to 3.0% by weight in terms of RO, and silicon atoms in an amount of from 0.3 to 1.0% by weight in terms of $SiO_2$, the grain boundaries of AlN crystals being chiefly a YAG type crystalline phase. The sintered product is obtained by firing at a temperature as low as 1700° C. or lower, has a thermal conductivity of not smaller than 60 W/m•K, loses weight in an amount of not more than 10 mg/cm$^2$ when it is left to stand in a 4N NaOH aqueous solution maintained at 70° C. for one hour, and exhibits excellent resistance against the alkalis.

3 Claims, No Drawings

SINTERED ALUMINUM NITRIDE

BACKGROUND OF THE INVENTION

1. Field of the Invention

The present invention relates to a sintered aluminum nitride used as insulated boards of circuit boards or semiconductor packages. More particularly, the invention relates to a sintered aluminum nitride which can be fired at a low temperature and exhibits excellent resistance against chemicals and favorable thermal conductivity.

2. Description of the Prior Art

In recent years, known semiconductor devices are generating more heat accompanying a trend toward highly densely integrating the semiconductor elements. In order to eliminate malfunction of such semiconductor devices, it has become necessary to use a board which radiates heat out of these devices. However, an alumina material that has heretofore been used for the boards has a thermal conductivity which is as small as about 20 W/m•K. Attention, therefore, has been given to aluminum nitride having a high thermal conductivity. In its single crystalline form, the aluminum nitride has a theoretical thermal conductivity of as large as 320 W/m•K. In recent years, a sintered aluminum nitride has been developed having a thermal conductivity of not smaller than 200 W/m•K.

Such a sintered aluminum nitride is prepared by firing at a temperature of not lower than 1800° C. by adding, as a sintering assistant, a rare earth element compound (Japanese Patent Publication No. 46032/1988) or an alkaline earth element compound (Japanese Patent Publication No. 49510/1983, Japanese Laid-Open Patent Publication No. 10071/1986).

According to this method, however, the cost of production increases due to wear of jigs used for the firing, structure of the firing furnace and running costs. In order to decrease the cost of production, therefore, a firing method has been proposed at a temperature of as low as 1600° to 1700° C. by simultaneously adding a rare earth element compound and an alkaline earth element compound as sintering assistants (Japanese Patent Publications Nos. 49613/1994 and 17454/1995).

In producing the products such as packages by using a sintered product obtained by simultaneously adding a rare earth element compound and an alkaline earth element compound thereto, however, the sintered product is deteriorated in the step of plating due to chemicals such as acids and alkalis permitting its surfaces to be coarsened or discolored. In particular, the aluminum nitride itself dissolves in an alkaline chemical and is deteriorated to a conspicuous degree. Due to the firing at a low temperature, furthermore, the color tone on the surface of the sintered products tends to be whitened.

SUMMARY OF THE INVENTION

The object of the present invention, therefore, is to provide a sintered aluminum nitride obtainable by firing at a temperature of not higher than 1700° C. and exhibiting excellent resistance against destructive chemicals.

Another object of the present invention is to provide a sintered aluminum nitride which has the above-mentioned properties and is colored.

According to the present invention, there is provided a sintered aluminum nitride comprising aluminum nitride (AlN) as a chief component, rare earth elements (RE) in amounts of from 3 to 10% by weight in terms of $RE_2O_3$, alkaline earth elements (R) in amounts of from 0.3 to 1.0% by weight in terms of RO, silicon atoms in an amount of from 0.3 to 1.0% by weight in terms of $SiO_2$ and grain boundaries of AlN crystals being chiefly a YAG type crystalline phase, having a thermal conductivity of not smaller than 60 W/m•K, and losing weight in an amount of not smaller than 10 mg/cm² when it is left to stand in a 4N NaOH aqueous solution maintained at 70° C. for one hour.

Briefly stated, the present invention uses rare earth element compounds and alkaline earth element compounds in combination as sintering assistants, contains a predetermined amount of silicon compound, and permits the YAG type crystalline phase to be precipitated as a chief crystalline phase on the grain boundaries, and has, thus, succeeded in obtaining a sintered aluminum nitride that is excellently sintered at a low temperature and exhibits excellent resistance against volatile chemicals and, particularly, against the alkalis.

By using tungsten (W), molybdenum (Mo) or a compound thereof as a coloring agent, furthermore, a sintered product is obtained which is colored exhibiting a brightness index L* and chroma C* which are not larger than predetermined values.

According to the present invention, it is preferred that Mg, Ca and/or Sr are contained as alkaline earth elements.

DETAILED DESCRIPTION OF THE INVENTION (Rare earth elements and alkaline earth elements)

The rare earth elements (RE) and the alkaline earth elements (R) contained in the sintered product of the present invention come from the sintering assistants. By using the compounds of these elements as sintering assistants, it is possible to obtain a sintered aluminum nitride having a large thermal conductivity through sintering at a low temperature. Upon firing, for example, a molded article of aluminum nitride containing the sintering assistants at a predetermined ratio at a temperature of not higher than 1700° C. in a nitrogen-containing atmosphere, is used to obtain a sintered product having a relative density (density ratio relative to a theoretic density) of not smaller than 98% and a thermal conductivity of not smaller than 60 W/m•K.

That is, when the aluminum nitride powder is fired being blended with rare earth element compounds, then, oxygen which is an impurity contained in the starting aluminum nitride powder reacts with rare earth elements to form a liquid phase which promotes the sintering. It is further used to obtain a sintered product having a large thermal conductivity by forming a crystalline phase such as of the YAG type, YAP type or YAM type during the sintering to decrease, the amount of oxygen which solid-dissolves in aluminum nitride particles. On the other hand, the alkaline earth element reacts with oxygen which is an impurity in the starting aluminum nitride powder and forms a liquid phase at a temperature lower than that of when a rare earth element is used, to thereby promote the sintering. It is further contemplated to increase the thermal conductivity by forming an alkaline earth aluminate during the sintering to decrease the amount of oxygen which solid-dissolves in the aluminum nitride particles that constitute the sintered product.

In the sintered product of the present invention, therefore, it is essential that the above-mentioned rare earth elements (RE) are contained in amounts of from 3 to 10% by weight and, particularly, from 5 to 10% by weight in terms of $RE_2O_3$ and that the alkaline earth elements (R) are contained in amounts of from 0.3 to 3.0% by weight in terms of RO.

When the amounts of these elements are smaller than the above-mentioned ranges, it becomes difficult to effect the firing at a low temperature. When the amounts are larger than the above-mentioned ranges, on the other hand, the absolute amounts of the grain boundary components increase causing the thermal conductivity to decrease.

Examples of the rare earth elements (RE) include Y, La, Ce, Pr, Nd, Pm, Sm, Eu, Gd, Tb, Dy, Ho, Er, Tm, Yb and Lu. The sintered product of the present invention may contain any rare earth element in one kind or in a combination of two or more kinds. Generally, it is desired to use Er and Yb from the standpoint of resistance against the aforementioned chemicals. It is desired that these rare earth elements are used as sintering assistants, particularly, in the form of oxides. These elements, however, may be used in a form which turns into an oxide upon firing, such as in the form of various metal salts like acetate, nitrate, etc., or in the form of nitrides and carbides.

Examples of the alkaline earth elements include Ba, Ca, Mg and Sr. In the present invention, as the alkaline earth elements, Mg may be contained in an amount of 0.05 to 1.0% by weight in terms of MgO. It is further desired that the alkaline earth elements rather than magnesium, Ca and/or Sr may be contained together with Mg in the sintered product. On condition that the total amounts of the alkaline earth elements lie within the above-mentioned range, Ca can be contained in an amount of 0.1 to 1.0% by weight in terms of CaO, and Sr can be contained in an amount of 1.0 to 2.5% by weight in terms of SrO. From the standpoint of the sintering property at a low temperature and the thermal conductivity, it is preferred that Mg and Ca, or Mg and Sr as the alkaline earth elements are contained in the above amount ranges.

It is desired that the alkaline earth elements are used as sintering assistants together with the above-mentioned rare earth elements, and are used, particularly, in the form of carbonates. The alkaline earth elements, however, can also be used in the form of various metal salts that turn into oxides upon firing, such as acetates and nitrates, or can be used in the form of composite oxides containing the rare earth elements.

(Grain Boundary Crystalline Phase)

In the sintered product of the present invention, what is important is that the YAG type crystalline phase is precipitated as a main crystalline phase on the grain boundaries from the standpoint of resistance against the chemicals as discussed above. In the sintered aluminum nitride containing rare earth elements, crystalline phases such as of the YAG type, YAP type and YAM type can be precipitated as a grain boundary crystalline phase. When the YAP type or the YAM type crystalline phase is precipitated as a main crystalline phase on the grain boundaries, however, the resistance against the harmful chemicals is not obtained as desired.

In order that the YAG type crystalline phase is precipitated as a main crystalline phase on the grain boundaries, it is necessary to adjust the molar ratio ($Al_2O_3/RE_2O_3$) of the rare earth element compound (in terms of $RE_2O_3$) used as a sintering assistant to the $Al_2O_3$ calculated from the amount of oxygen which is an impurity contained in the starting aluminum nitride powder. That is, in theory, the YAG type crystalline phase precipitates when the molar ratio is 1.67. In order that the YAG type crystalline phase is stably crystallized, however, the composition must be rich in $Al_2O_3$. It is therefore desired to set the molar ratio to lie within a range of from 1.7 to 20.0. Therefore, when the starting aluminum nitride powder contains a small amount of oxygen which is an impurity, it is desired to add $Al_2O_3$ so that the molar ratio lies within the above-mentioned range. Usually, it is desired that $Al_2O_3$ is added in an amount of not larger than 5.0% by weight with respect to the amount of the aluminum nitride powder which is the starting material.

(Silicon component)

In the sintered product of the present invention, furthermore, the YAG type crystalline phase is precipitated on the grain boundaries as a main crystalline phase, and the silicon content is adjusted to be from 0.3 to 1.0% by weight, preferably, from 0.4 to 1.0% by weight and, most preferably, from 0.5 to 0.9% by weight in terms of $SiO_2$, so that a very high resistance against the chemicals is exhibited. For example, the sintered product of the present invention loses the weight by not more than 10 $mg/cm^2$ when it is left to stand in a 4N NaOH aqueous solution maintained at 70° C. for one hour. When the sintered product is used as a wiring board, therefore, the wiring board is effectively prevented from being corroded by chemicals such as alkali that are used at the time of plating the wiring layer formed on the board, making it possible to effectively prevent a drop in the properties of the board. When the content of silicon is smaller than the above-mentioned range, these resistance against the chemicals is not sufficient. When the content of silicon is larger than the above-mentioned range, on the other hand, the amounts of silicon solid-dissolving in the aluminum nitride crystals increase, causing the sintered product to lose the thermal conductivity.

The above-mentioned silicon component is added as a silicon oxide such as silica to a powder of the starting material that is to be fired. The silicon component, however, may have been partly mixed as an impurity metal in the powder of the starting aluminum nitride powder. When added as a composite oxide with an alkaline earth element such as $MgSiO_3$ (talc), the silicon component helps enhance the sintering property at low temperatures.

(Coloring component)

The sintered product of the present invention may contain at least one of tungsten (W) and molybdenum (Mo) as a coloring component (blackening material) in addition to the above-mentioned elements. The sintered product containing the coloring component is colored exhibiting a brightness index $L^*$ of not larger than 50 and a chroma $C^*$ of not larger than 2 without color shading but having a homogeneous color tone. When used as a wiring board, therefore, the wiring layer formed on the board can be vividly recognized giving advantage at the time of bonding wires. When the brightness index $L^*$ is larger than 50, the wiring board can be seen less vividly, and develops color shading. When the chroma $C^*$ is larger than 2, the wiring board can be seen less vividly, too. It is desired that the coloring component is contained in an amount of from 0.05 to 0.5% by weight, and particularly 0.1 to 0.4% by weight in terms of an oxide including, for example $WO_3$ or $MoO_3$. When the amount is smaller than this range, the wiring board is insufficiently colored. When the amount is larger than this range, the sintered product may lose thermal conductivity.

The color component can be added in the form of, for example, a single metal or an oxide, to the powder of the starting material that is to be fired.

(AlN powder)

The aluminum nitride powder used for the preparation of the above-mentioned sintered aluminum nitride may be obtained by a known method such as direct nitrogenation method (DN method) or reductive nitrogenation method (RN method). Some AlN powders obtained by DN method contain a large amount of silicon as impurity metals. Therefore, the AlN powder obtained by DN method has the advantage of a silicon source, and has the advantage of a lower cost, too. From the standpoint of high thermal conductivity, the AlN powder obtained by RN method is advantageous, when it is used as a starting material, however, the cost of production tends to be high. In order to make the best of the merit of each AlN powder, the AlN powder of DN method and the AlN powder of RN method are mixed, and the mixture can be used as a starting material. It is desired that the aluminum nitride powder as a starting material contains oxygen which is an impurity in an amount of from about 1.0 to 2.0% by weight and has an average particle diameter of from 1.5 to 2.5 μm.

(Preparation of a sintered product)

The sintered aluminum nitride of the present invention is obtained by mixing compounds such as oxides or single metals that serve as element sources and a powder of aluminum nitride together such that the contents of the elements lie within predetermined ranges, and mixing, as required, aluminum oxide ($Al_2O_3$) to form a molded article thereof, followed by firing.

The molded article is obtained by, for example, mixing a molding assistant such as an organic binder or a plasticizer to a mixture powder of starting materials sufficiently uniformly by using a mill or the like, and molding the obtained mixture into any desired form by a suitable molding means such as metal mold press, cold hydrostatic press, extrusion molding, doctor blade method or rolling.

The obtained molded article is dewaxed and is fired in a nonoxidizing atmosphere containing nitrogen at a temperature of not higher than 1700° C. and, particularly, at a temperature of from 1550° to 1680° C. for 1 to 10 hours to obtain a sintered product having a relative density of not smaller than 98%. When the AlN powder of DN method is used as a starting material, the oxidation of AlN is promoted by dewaxing in the oxygen-containing atmosphere and therefore, impurity oxygen contents of the sintered product increase by about 1 to 2% by weight.

As mentioned earlier, the sintered product has excellent resistance against chemicals, and a thermal conductivity which is as high as not smaller than 60 W/m·K and, particularly, from 60 to 120 W/m·K. When a coloring component is contained, furthermore, the sintered product exhibits uniform black color without shading.

The sintered product of the present invention having the above-mentioned properties can be used in a variety of fields such as circuit boards, packages for holding semiconductor elements, etc., and makes it possible to provide cheap and highly reliable products featuring high thermal conductivity. Particularly, the sintered product of the present invention can be effectively used for preparing a multilayer interconnection substrate. This substrate can be obtained by applying metallized paste which contains W or Mo to the surface of the AlN molded article in the form of the wiring pattern, laminating a plurality of the AlN method articles having the metallized paste and firing simultaneously the AlN molded articles with the metallized paste in the firing condition as above-mentioned.

(EXAMPLES)

The invention will now be described by way of Experiments.

(Experiment 1)

A powder of aluminum nitride (average particle diameter: 2.0 μm, amount of oxygen: 1.7% by weight) obtained by the direct nitrogenation method, rare earth element oxides and alkaline earth element oxides, and optionally silica and aluminum oxide were mixed together to obtain compositions as shown in Table 1 (the amount of $SiO_2$ in Table 1 includes Si contained in the starting AlN in terms of the amount of $SiO_2$).

To the mixture powder were added paraffin wax (organic binder) and isopropyl alcohol (solvent). The mixture was kneaded, dried and passed through a sieve to obtain grains for molding. The grains were molded by a metal mold-press under a condition of a molding pressure of 1 ton/cm$^2$ to obtain a disc of a size of 12 mm in diameter and 5 mm in thickness.

After being dewaxed in an oxygen-containing atmosphere, the disc was fired in a forming ($N_2+H_2$) stream at 1650° C. for 6 hours to obtain a sintered product. (In samples Nos. 28 and 29, dewaxing was carried out in a nitrogen-atmosphere.)

The sintered product was identified for its grain boundary crystalline phase and measured for its properties in accordance with the methods described below. The results were also shown in Table 1. Identification of grain boundary crystalline phase:

Identified based upon the X-ray diffraction. Relative density:

The density of the sintered product was measured by the Archimedes' method, and the relative density was calculated based on the measured results. Thermal conductivity:

The sample having a thickness of 3 mm was measured by the laser flash method at room temperature. Resistance against the chemicals:

The sample was immersed in a 4N NaOH aqueous solution maintained at 70° C. for one hour to measure a change in the weight of the sample. The smaller the change in the weight, the more excellent the resistance against the chemicals (against alkalis).

TABLE 1

| Sample No. | Composition (% by wt.) Remainder AlN | | | | | Relative density (%) | Thermal conductivity (W/mK) | Grain boundary crystal phase (note 1) | Loss of weight (mg/cm$^2$) |
|---|---|---|---|---|---|---|---|---|---|
| | $RE_2O_3$ | CaO | MgO | $SiO_2$ | $Al_2O_3$ | | | | |
| *1 | $Er_2O_3$ 1 | 0.5 | 0.2 | 0.7 | 0 | 95.3 | 59 | YAG,CA | 34.3 |
| 2 | " 3 | 0.5 | 0.2 | 0.7 | 0 | 99.2 | 67 | YAG,CA | 8.0 |
| 3 | " 5 | 0.5 | 0.2 | 0.7 | 0 | 99.5 | 73 | YAG,CA | 1.4 |
| 4 | " 10 | 0.5 | 0.2 | 0.7 | 0 | 99.4 | 73 | YAG,CA | 1.1 |
| *5 | " 12 | 0.5 | 0.2 | 0.7 | 0 | 99.4 | 56 | YAG,CA | 1.3 |
| *6 | $Er_2O_3$ 8 | 0.05 | 0.2 | 0.7 | 0 | 92.3 | 62 | YAG | 21.3 |

TABLE 1-continued

| Sample No. | Composition (% by wt.) Remainder AlN | | | | | Relative density (%) | Thermal conductivity (W/mK) | Grain boundary crystal phase (note 1) | Loss of weight (mg/cm$^2$) |
|---|---|---|---|---|---|---|---|---|---|
| | RE$_2$O$_3$ | CaO | MgO | SiO$_2$ | Al$_2$O$_3$ | | | | |
| 7 | " | 8 | 0.1 | 0.2 | 0.7 | 0 | 98.8 | 71 | YAG,CA | 2.1 |
| 8 | " | 8 | 0.3 | 0.2 | 0.7 | 0 | 99.2 | 75 | YAG,CA | 1.4 |
| 9 | " | 8 | 0.7 | 0.2 | 0.7 | 0 | 99.5 | 76 | YAG,CA | 1.9 |
| 10 | " | 8 | 1.0 | 0.2 | 0.7 | 0 | 99.5 | 74 | YAG,CA | 9.3 |
| 11 | " | 8 | 1.5 | 0.2 | 0.1 | 0 | 99.7 | 62 | YAG,CA | 23.4 |
| *12 | Er$_2$O$_3$ | 8 | 0.5 | 0 | 0.2 | 0 | 99.6 | 70 | YAG,CA | 13.1 |
| 13 | " | 8 | 0.5 | 0.1 | 0.3 | 0 | 99.4 | 74 | YAG,CA | 4.8 |
| *14 | " | 8 | 0.8 | 2.4 | 0.3 | 0 | 99.7 | 50 | YAG,CA | 1.3 |
| 15 | " | 8 | 0.5 | 0.1 | 0.5 | 0 | 99.6 | 76 | YAG,CA | 0.8 |
| 16 | Er$_2$O$_3$ | 8 | 0.5 | 0.2 | 0.7 | 0 | 99.4 | 73 | YAG,CA | 1.3 |
| 17 | " | 8 | 0.5 | 0.8 | 0.7 | 0 | 99.7 | 70 | YAG,CA | 1.4 |
| 18 | " | 8 | 0.5 | 1.0 | 0.7 | 0 | 99.5 | 63 | YAG,CA | 1.4 |
| 19 | " | 8 | 0.5 | 0.5 | 1.0 | 0 | 99.3 | 63 | YAG,CA | 1.7 |
| *20 | " | 8 | 0.5 | 0.5 | 1.5 | 0 | 99.4 | 55 | YAG,CA | 1.6 |
| 21 | Er$_2$O$_3$ | 8 | 0.5 | 0.2 | 0.7 | 0.5 | 99.4 | 75 | YAG,CA | 1.0 |
| 22 | " | 8 | 0.5 | 0.2 | 0.7 | 1.0 | 99.4 | 74 | YAG,CA | 0.9 |
| 23 | " | 8 | 0.5 | 0.2 | 0.7 | 3.0 | 98.8 | 69 | YAG;CA | 1.3 |
| 24 | " | 8 | 0.5 | 0.2 | 0.7 | 5.0 | 98.6 | 61 | YAG,CA | 1.2 |
| 25 | Yb$_2$O$_3$ | 8 | 0.5 | 0.2 | 0.7 | 0 | 99.3 | 74 | YAG,CA | 1.5 |
| 26 | Dy$_2$O$_3$ | 8 | 0.5 | 9.2 | 0.7 | 0 | 99.1 | 74 | YAG,CA | 1.5 |
| 27 | Y$_2$O$_3$ | 8 | 0.5 | 0.2 | 0.7 | 0 | 99.3 | 74 | YAG,CA | 1.8 |
| *28 | Er$_2$O$_3$ | 12 | — | 0.2 | 0.7 | 0 | 88.1 | 51 | YAM | could not be measured |
| *29 | Er$_2$O$_3$ | 8 | — | 0.2 | 0.7 | 0 | 89.0 | 53 | YAP | could not be measured |

*samples marked with * lie outside the range of the present invention.
note 1: CA = calcium aluminate As will be obvious from the results of Table 1, the products of the present invention exhibit high thermal conductivities and excellent resistance against chemicals.

The samples Nos. 1 and 6 containing rare earth elements and alkaline earth elements in amounts smaller than the ranges of the present invention, exhibit smaller relative densities, have insufficient densities, lower thermal conductivities and smaller resistance against the alkalis. The samples Nos. 5 and 14 containing these elements in amounts larger than the ranges of the present invention, exhibit low thermal conductivities and small resistivities against alkalis.

It will further be understood that the resistance against the alkalis decreases as the amount of silicon becomes smaller than 0.3% by weight as represented by a sample No. 12. Besides, the sample No. 20 containing silicon in an amount in excess of 1.0% by weight exhibits greatly decreased thermal conductivity.

Moreover, the samples Nos. 28 and 29 in which YAM type or YAP type crystalline phase is precipitating as the grain boundary crystalline phase, are so poorly sintered that they could not be tested for their resistance against the alkalis.

(Experiment 2)

Sintered products were prepared in the same manner as in Experiment 1 except using tungsten oxide or molybdenum oxide, and were measured for their properties, brightness indexes L* and chromas C*. Tables 2 and 3 show the results together with the compositions of the sintered products.

Incidentally, samples Nos. 72 and 73 were prepared using AlN powders (average particle: 1.2 μm, O$_2$ contents: 0.8% by weight) of RN method as starting materials. Samples Nos. 74 to 76 were prepared using the mixture of AlN powder used in Experiment 1 (DN method) and the above AlN powder (RN method). The mixture ratio (DN method powder/RN method powder) was 90/10 by weight. These samples Nos. 72 to 76 were obtained by firing at the temperature of 1650° C. for 3 hours. In preparing samples Nos. 70 and 71, dewaxing was carried out in N$_2$ atmosphere, and in other samples, dewaxing was carried out in O$_2$-containing atmosphere.

The brightness indexes L* and chromas C* were measured by using a spectral calorimeter (CM-3700d manufactured by Minolta Co.).

As will be obvious from the results of Tables 2 and 3, the sample No. 55 containing Mo in an amount smaller than the range specified by the present invention exhibits a large brightness index and is not blackened to a sufficient degree. A sample No. 60 containing Mo in an amount larger than the range specified by the present invention, on the other hand, exhibits a decreased thermal conductivity.

Moreover, a sample No. 69 containing Cr of the same Group as Mo and W, exhibits a large chroma and is blackened insufficiently.

TABLE 2

| Sample No. | Composition (% by wt.) Remainder AlN | | | | | | | Relative density (%) | Thermal conductivity (W/mK) | Brightness index L* | Chroma C* | Grain boundary crystal phase (note 1) | Loss of weight (mg/cm²) |
|---|---|---|---|---|---|---|---|---|---|---|---|---|---|
| | RE₂O₃ | CaO | MgO | SiO₂ | Al₂O₃ | Mo, W | | | | | | | |
| *30 | Er₂O₃ | 1 | 0.5 | 0.2 | 0.7 | 0 | MoO₃ | 0.2 | 95.4 | 58 | 51 | 1.5 | YAG,CA | 36.0 |
| 31 | " | 3 | 0.5 | 0.2 | 0.7 | 0 | " | 0.2 | 99.1 | 65 | 46 | 0.8 | YAG,CA | 8.4 |
| 32 | " | 5 | 0.5 | 0.2 | 0.7 | 0 | " | 0.2 | 99.3 | 73 | 41 | 0.9 | YAG,CA | 1.5 |
| 33 | " | 10 | 0.5 | 0.2 | 0.7 | 0 | " | 0.2 | 99.4 | 73 | 39 | 0.9 | YAG,CA | 1.2 |
| *34 | " | 12 | 0.5 | 0.2 | 0.7 | 0 | " | 0.2 | 99.5 | 55 | 41 | 1.3 | YAG,CA | 1.5 |
| *35 | Er₂O₃ | 8 | 0.05 | 0.2 | 0.7 | 0 | MoO₃ | 0.2 | 92.1 | 61 | 54 | 1.3 | YAG | 20.0 |
| 36 | " | 8 | 0.1 | 0.2 | 0.7 | 0 | " | 0.2 | 98.8 | 70 | 48 | 0.9 | YAG,CA | 1.7 |
| 37 | " | 8 | 0.3 | 0.2 | 0.7 | 0 | " | 0.2 | 99.4 | 77 | 42 | 0.6 | YAG,CA | 1.6 |
| 38 | " | 8 | 0.7 | 0.2 | 0.7 | 0 | " | 0.2 | 99.6 | 76 | 38 | 0.7 | YAG,CA | 2.6 |
| 39 | " | 8 | 1.0 | 0.2 | 0.7 | 0 | " | 0.2 | 99.7 | 74 | 40 | 0.8 | YAG,CA | 8.3 |
| *40 | " | 8 | 1.5 | 0.2 | 0.1 | 0 | " | 0.2 | 99.7 | 60 | 40 | 0.9 | YAG,CA | 24.0 |
| 41 | Er₂O₃ | 8 | 0.5 | 0 | 0.2 | 0 | MoO₃ | 0.2 | 99.6 | 71 | 41 | 0.8 | YAG,CA | 12.0 |
| 42 | " | 8 | 0.5 | 0.1 | 0.3 | 0 | " | 0.2 | 99.5 | 73 | 37 | 0.8 | YAG,CA | 5.1 |
| *43 | " | 8 | 1.7 | 1.5 | 0.3 | 0 | " | 0.2 | 99.8 | 52 | 38 | 1.1 | YAG,CA | 1.1 |
| 44 | " | 8 | 0.5 | 0.1 | 0.5 | 0 | " | 0.2 | 99.6 | 76 | 38 | 0.9 | YAG,CA | 0.8 |
| 45 | " | 8 | 0.5 | 0.2 | 0.7 | 0 | " | 0.2 | 99.7 | 71 | 41 | 0.9 | YAG,CA | 1.4 |
| 46 | " | 8 | 0.5 | 0.8 | 0.7 | 0 | " | 0.2 | 99.6 | 72 | 38 | 1.0 | YAG,CA | 1.1 |
| 47 | " | 8 | 0.5 | 1.0 | 0.7 | 0 | " | 0.2 | 99.4 | 61 | 38 | 0.9 | YAG,CA | 1.3 |
| 48 | " | 8 | 0.5 | 0.5 | 1.0 | 0 | " | 0.2 | 99.5 | 66 | 39 | 0.9 | YAG,CA | 1.3 |
| *49 | " | 8 | 0.5 | 0.5 | 1.5 | 0 | " | 0.2 | 99.5 | 58 | 40 | 0.6 | YAG,CA | 1.7 |

Samples marked with * lie outside the range of the present invention.
note 1: CA = calcium aluminate

TABLE 3

| Sample No. | Composition (% by wt.) Remainder AlN | | | | | | | Relative density (%) | Thermal conductivity (W/mK) | Brightness index L* | Chroma C* | Grain boundary crystal phase (note 1) | Loss of weight (mg/cm²) |
|---|---|---|---|---|---|---|---|---|---|---|---|---|---|
| | RE₂O₃ | CaO | MgO | SiO₂ | Al₂O₃ | Mo, W | | | | | | | |
| 50 | Er₂O₃ | 8 | 0.5 | 0.2 | 0.7 | 0 | MoO₃ | 0.2 | 99.7 | 78 | 41 | 0.7 | YAG,CA | 0.9 |
| 51 | " | 8 | 0.5 | 0.2 | 0.7 | 0.5 | " | 0.2 | 99.4 | 74 | 40 | 0.7 | YAG,CA | 1.1 |
| 52 | " | 8 | 0.5 | 0.2 | 0.7 | 1.0 | " | 0.2 | 99.4 | 72 | 40 | 0.7 | YAG,CA | 1.3 |
| 53 | " | 8 | 0.5 | 0.2 | 0.7 | 3.0 | " | 0.2 | 98.9 | 68 | 40 | 0.8 | YAG,CA | 1.1 |
| 54 | " | 8 | 0.5 | 0.2 | 0.7 | 5.0 | " | 0.2 | 98.7 | 60 | 40 | 0.9 | YAG,CA | 1.3 |
| *55 | Er₂O₃ | 8 | 0.5 | 0.2 | 0.7 | 0 | MoO₃ | 0.01 | 99.5 | 81 | 59 | 1.8 | YAG,CA | 1.1 |
| 56 | " | 8 | 0.5 | 0.2 | 0.7 | 0 | " | 0.05 | 99.7 | 78 | 48 | 1.6 | YAG,CA | 1.2 |
| 57 | " | 8 | 0.5 | 0.2 | 0.7 | 0 | " | 0.1 | 99.5 | 78 | 43 | 1.0 | YAG,CA | 1.1 |
| 58 | " | 8 | 0.5 | 0.2 | 0.7 | 0 | " | 0.3 | 99.5 | 76 | 39 | 0.8 | YAG,CA | 1.4 |
| 59 | " | 8 | 0.5 | 0.2 | 0.7 | 0 | " | 0.5 | 99.5 | 73 | 36 | 0.6 | YAG,CA | 0.9 |
| *60 | " | 8 | 0.5 | 0.2 | 0.7 | 0 | " | 0.7 | 99.4 | 58 | 35 | 0.8 | YAG,CA | 1.1 |
| 61 | Er₂O₃ | 8 | 0.5 | 0.2 | 0.7 | 0 | WO₃ | 0.2 | 99.5 | 78 | 42 | 1.0 | YAG,CA | 1.1 |
| 62 | " | 8 | 0.5 | 0.2 | 0.7 | 0 | " | 0.4 | 99.5 | 78 | 35 | 1.0 | YAG,CA | 1.1 |
| 63 | Yb₂O₃ | 8 | 0.5 | 0.2 | 0.7 | 0 | WO₃ | 0.2 | 99.2 | 74 | 42 | 0.9 | YAG,CA | 1.4 |
| 64 | Yb₂O₃ | 8 | 0.5 | 0.2 | 0.7 | 0 | " | 0.4 | 99.1 | 72 | 36 | 0.9 | YAG,CA | 1.5 |
| 65 | Dy₂O₃ | 8 | 0.5 | 0.2 | 0.7 | 0 | " | 0.2 | 99.3 | 75 | 41 | 0.8 | YAG,CA | 1.3 |
| 66 | Dy₂O₃ | 8 | 0.5 | 0.2 | 0.7 | 0 | " | 0.4 | 99.3 | 74 | 36 | 0.8 | YAG,CA | 1.2 |
| 67 | Y₂O₃ | 8 | 0.5 | 0.2 | 0.7 | 0 | " | 0.2 | 99.1 | 74 | 41 | 0.9 | YAG,CA | 1.8 |
| 68 | Y₂O₃ | 8 | 0.5 | 0.2 | 0.7 | 0 | " | 0.4 | 99.1 | 73 | 37 | 0.8 | YAG,CA | 1.6 |
| *69 | Er₂O₃ | 8 | 0.5 | 0.2 | 0.7 | 0 | Cr₂O₃ | 0.2 | 99.5 | 71 | 41 | 3.1 | YAG,CA | 1.5 |
| *70 | Er₂O₃ | 12 | — | 0.2 | 0.7 | 0 | MoO₃ | 0.2 | 88.1 | 52 | 73 | 2.8 | YAM | X |
| *71 | Er₂O₃ | 8 | — | 0.2 | 0.7 | 0 | " | 0.2 | 89.3 | 55 | 78 | 2.6 | YAP | X |
| 72 | Er₂O₃ | 8 | 0.5 | 0.2 | 0.7 | 3.9 | MoO₃ | 0.2 | 99.8 | 83 | 42 | 0.7 | YAG,CA | 1.2 |
| 73 | " | 8 | 0.5 | 0.2 | 0.7 | 3.0 | WO₃ | 0.2 | 99.7 | 82 | 48 | 0.7 | YAG,CA | 1.4 |
| 74 | " | 8 | 0.5 | 0.2 | 0.7 | 0 | MoO₃ | 0.2 | 99.7 | 78 | 43 | 0.7 | YAG,CA | 1.4 |
| 75 | " | 8 | 0.5 | 0.2 | 0.7 | 0 | WO₃ | 0.2 | 99.8 | 76 | 48 | 0.8 | YAG,CA | 1.5 |
| 76 | Er₂O₃ | 5 | 0.5 | 0.2 | 0.7 | 0 | MoO₃ | 0.2 | 99.6 | 72 | 42 | 0.7 | YAG,CA | 1.6 |

Samples marked with * lie outside the range of the present invention.
note 1:
CA = calcium aluminate
X: could not be measured (Experiment 3)

With the AlN powder of DN method as used in Experiment 1, $CaCO_3$, $SrCO_3$, $Er_2O_3$, $SiO_2$, WO3 and $MoO_3$ were made into a mixture, and further optionally $Al_2O_3$ was made into a mixture to obtain compositions as shown in Tables 4 and 5. By molding each of the compositions in the same manner as in Experiment 1, disc (molded article) was prepared, respectively. The disk was dewaxed in an oxygen-containing atmosphere and was fired in the $N_2$ atmosphere, at the temperature of 1650° C. for 6 hours to obtain a sintered product. The sintered product was estimated in the same manner as in Experiment 1 and the result was shown in Tables 4 and 5.

Incidentally, sample No. 91 was obtained by using the AlN powder of RN method as used in Experiment 2. In sample No. 92, the mixture powder of the AlN powder of DN method and the AlN powder of RN method (mixture weight ratio of DN/RN=90/10) was used as the starting AlN powder. In samples 91 and 92, firing was performed in the $N_2$ atmosphere at the temperature of 1650° C. for 3 hours.

From the results of Tables 4 and 5, it will be understood that even when SrO was used as the oxide of alkaline earth element, all the sintered products of the present invention have a high thermal conductivity and excellent resistance against alkalis.

TABLE 4

| Sample No. | Composition (% by wt.) Remainder AlN | | | | | Relative density (%) | Thermal conductivity (W/mK) | Grain boundary crystal phase (note 1) | Loss of weight (mg/cm$^2$) |
|---|---|---|---|---|---|---|---|---|---|
| | $RE_2O_3$ | SrO | MgO | $SiO_2$ | $Al_2O_3$ | | | | |
| 77 | $Er_2O_3$ 3 | 2.0 | 0.2 | 0.7 | 0 | 99.3 | 72 | YAG,SA | 7.6 |
| 78 | " 8 | 2.0 | 0.2 | 0.7 | 0 | 99.5 | 74 | YAG,SA | 1.8 |
| 79 | " 10 | 2.0 | 0.2 | 0.7 | 0 | 99.6 | 73 | YAG,SA | 1.5 |
| *80 | " 12 | 2.0 | 0.2 | 0.7 | 0 | 99.3 | 58 | YAG,SA | 1.6 |
| *81 | " 8 | 0.1 | 0.1 | 0.7 | 0 | 99.3 | 55 | YAG,SA | 31.8 |
| 82 | " 8 | 1.0 | 0.3 | 0.7 | 0 | 98.7 | 65 | YAG,SA | 5.1 |
| 83 | " 8 | 1.5 | 0.3 | 0.7 | 0 | 99.4 | 71 | YAG,SA | 1.2 |
| 84 | " 8 | 2.5 | 0.3 | 0.7 | 0 | 99.4 | 75 | YAG,SA | 6.6 |
| *85 | " 8 | 3.0 | 0.3 | 0.7 | 0 | 99.1 | 70 | YAG,SA | 12.8 |
| 86 | " 8 | 2.0 | 0.2 | 0.1 | 0 | 99.3 | 74 | YAG,SA | 3.9 |
| 87 | " 8 | 2.0 | 0.2 | 0.5 | 0 | 99.5 | 73 | YAG,SA | 2.0 |
| 88 | " 8 | 2.0 | 0.2 | 1.0 | 0 | 99.6 | 66 | YAG,SA | 1.3 |
| *89 | " 8 | 2.0 | 0.2 | 1.2 | 0 | 99.7 | 59 | YAG,SA | 1.4 |
| 90 | " 8 | CaO 0.5 SrO 1.0 | 0.2 | 0.7 | 0 | 99.6 | 72 | YAG, CSA | 6.3 |
| 91 | " 8 | 2.0 | 0.2 | 0.5 | 3.0 | 99.8 | 78 | YAG,SA | 0.8 |
| 92 | " 8 | 2.0 | 0.2 | 0.7 | 0 | 99.5 | 77 | YAG,SA | 1.0 |

Samples marked with * lie outside the range of the present invention
note 1:
SA: strontium aluminate
CSA: calcium strontium aluminate

TABLE 5

| Sample No. | Composition (% by wt.) Remainder AlN | | | | | | | Relative density (%) | Thermal conductivity (W/mK) | Brightness index L* | Chroma C* | Grain boundary crystal phase (note 1) | Loss of weight (mg/cm$^2$) |
|---|---|---|---|---|---|---|---|---|---|---|---|---|---|
| | $RE_2O_3$ | SrO | MgO | $SiO_2$ | $Al_2O_3$ | Mo, W | | | | | | | |
| 93 | $Er_2O_3$ | 8 | 2.0 | 0.2 | 0.7 | 0 | Mo 0.1 | 99.2 | 71 | 40 | 1.0 | YAG,SA | 1.5 |
| 94 | " | 8 | 2.0 | 0.2 | 0.7 | 0 | Mo 0.4 | 99.4 | 66 | 37 | 0.8 | YAG,SA | 1.1 |
| *95 | " | 8 | 2.0 | 0.2 | 0.7 | 0 | Mo 0.7 | 99.4 | 59 | 35 | 0.8 | YAG,SA | 1.8 |
| 96 | " | 8 | 2.0 | 0.2 | 0.7 | 0 | W 0.2 | 99.3 | 70 | 45 | 0.8 | YAG,SA | 1.6 |
| 97 | " | 8 | 2.0 | 0.2 | 0.7 | 0 | W 0.5 | 99.4 | 65 | 39 | 0.9 | YAG,SA | 1.7 |
| 98 | " | 8 | CaO 0.5 SrO 2.0 | 0.2 | 0.7 | 0 | Mo 0.2 | 99.5 | 64 | 39 | 0.8 | YAG, CSA | 8.3 |

Samples marked with * lie outside the range of the present invention
note 1:
SA: strontium aluminate
CSA: calcium strontium aluminate

We claim:

1. A sintered aluminum nitride comprising:

aluminum nitride (AlN);

rare earth elements (RE) in amounts from 3 to 10% by weight in terms of $Re_2O_3$;

alkaline earth elements (R) in amounts of from 0.3 to 3.0% by weight in terms RO; and silicon atoms in an amount of from 0.3 to 1.0% by weight in terms of $SIO_2$;

wherein the alkaline earth elements consist of Mg and at least one of Ca and Sr, Mg is present in an amount of from 0.05 to 1.0% by weight in terms of MgO, and Ca is present in an amount of from 0.1 to 1.0% by weight in terms of CaO;

a YAG type crystalline phase precipitated on grain boundaries of AlN crystals;

and further wherein the sintered aluminum nitride has a thermal conductivity of not smaller than 60 W/m·K; and when the sintered aluminum nitride is left to stand in a 4N NaOH aqueous solution maintained at 70° C. for one hour, the weight loss per surface area of the sintered aluminum nitride is not more than 10 mg/cm$^2$.

2. A sintered aluminum nitride according to claim 1, further comprising at least one of W or Mo in an amount of from 0.05 to 0.5% by weight in terms of at least one of $WO_3$ or $MoO_3$, and the sintered aluminum nitride has a brightness index L* of not larger than 50 and a chroma C* of not larger than 2.

3. A sintered aluminum nitride according to claim 1, which is obtained by firing a material containing aluminum nitride, rare earth elements, alkaline earth elements and silicon atoms at a temperature of not higher than 1700° C. in a nitrogen-containing atmosphere.

* * * * *